(12) United States Patent
Chen

(10) Patent No.: US 12,464,855 B1
(45) Date of Patent: Nov. 4, 2025

(54) PHOTODIODE HEATER

(71) Applicant: ACACIA TECHNOLOGY, INC., San Jose, CA (US)

(72) Inventor: Long Chen, Marlboro, NJ (US)

( * ) Notice: Subject to any disclaimer, the term of this patent is extended or adjusted under 35 U.S.C. 154(b) by 238 days.

(21) Appl. No.: 15/857,810

(22) Filed: Dec. 29, 2017

(51) Int. Cl.
  *H10F 77/60* (2025.01)
  *H10F 39/10* (2025.01)
  *H10F 71/10* (2025.01)
  *H10F 77/122* (2025.01)
  *H10N 19/00* (2023.01)

(52) U.S. Cl.
  CPC ........... *H10F 77/60* (2025.01); *H10F 39/103* (2025.01); *H10F 71/1035* (2025.01); *H10F 77/122* (2025.01); *H10N 19/00* (2023.02)

(58) Field of Classification Search
  CPC .............................. H01L 31/024; H10F 77/60
  See application file for complete search history.

(56) References Cited

U.S. PATENT DOCUMENTS

| | | | |
|---|---|---|---|
| 9,933,639 B1* | 4/2018 | Lin | G02F 1/025 |
| 2005/0285228 A1* | 12/2005 | Sugawara | H01L 23/045 |
| | | | 257/584 |
| 2014/0104668 A1* | 4/2014 | Feng | G02F 1/009 |
| | | | 359/288 |
| 2015/0243800 A1* | 8/2015 | Shi | H01L 31/024 |
| | | | 257/186 |
| 2017/0092785 A1* | 3/2017 | Novack | H01L 31/1808 |
| 2017/0221779 A1* | 8/2017 | Linder | H01L 22/20 |
| 2019/0035948 A1* | 1/2019 | Bayn | H01L 31/103 |

* cited by examiner

*Primary Examiner* — Thanh Luu
(74) *Attorney, Agent, or Firm* — Patterson + Sheridan, LLP (57) ABSTRACT

An apparatus and system, including a chip including a photodetector, wherein the photodetector includes a semiconductor photodiode and a heater proximate to the photodiode; wherein the heater is enabled to increase a temperature of the photodiode and a temperature sensing device to determine the temperature of the photodiode.

22 Claims, 5 Drawing Sheets

PHOTODIODE HEATER

BACKGROUND

Typically, a photodetector is a material that can detect light by releasing an electric current in response to being exposed with light of a certain frequency. Usually, a type of material that makes up a photodetector determines what wavelengths of light will cause the photodetector to emit an electric current. Specifically, different materials absorb different wavelengths of light and generate an electron-hole pair or current. Usually, a photon may be absorbed and an electron-hole pair generated when the photon energy is larger than a bandgap energy. Usually, the bandgap refers to an energy difference between bands of electrons of a material. Generally, this may refer to the spacing of electrons in a material.

BRIEF DESCRIPTION OF THE FIGURES

Various aspects and embodiments of the application will be described with reference to the following example embodiments. It should be appreciated that the figures are not necessarily drawn to scale.

SUMMARY

An apparatus and system, including a temperature sensing device and a chip including a photodetector, wherein the photodetector includes a semiconductor photodiode and a heater proximate to the photodiode, wherein the heater is enabled to increase a temperature of the photodiode, and wherein the temperature sensing device is enabled to determine the temperature of the photodiode.

DETAILED DESCRIPTION

In many embodiments, a mechanism of detecting light for a photodetector may be through interband absorption in a semiconductor material. In some embodiments, the photodetector may absorb incoming photons that may excite electrons from the valance band to the conduction band, creating pairs of electron and hole, which may be then collected to form an electrical current. In many embodiments, an amount of absorption may depend on the energy (or frequency) of the photons. In certain embodiments, if photon energy is above a direct band gap, the absorption coefficient may be large. In most embodiments, as the photon energy falls below the direct band gap, the absorption coefficient may drop rapidly.

In some embodiments, the responsivity of a photodetector, which measures the amount of photocurrent collected for a given amount of incident optical power, may primarily depend on a percentage of light absorbed through an interband transition, which may be related to the material absorption coefficient and the interaction length of the photodetector.

For example, consider certain embodiments of a measured responsivity in unit of A/W and dB scale, for a waveguide-integrated germanium photodetector at room temperature. In these certain embodiments, epitaxially grown germanium has a band edge around 1.55 um. In these certain embodiments, at wavelengths shorter than the band edge, the absorption coefficient is sufficiently high and most of the light is absorbed by germanium, leading to relatively flat responsivity vs wavelength. In these certain embodiments, at wavelengths above the band edge, the responsivity drops rapidly. In these certain embodiments, at 1610 nm, for example, the responsivity is about 3 dB lower than the peak value. In these embodiments, at 1630 nm, the difference becomes nearly 5.5 dB.

In some embodiments, it may be possible to increase an interaction length of a photodetector to ensure high responsivity even if the material absorption coefficient drops with lower optical frequency or longer optical wavelength. In most embodiments, the current disclosure has realized that the absorption coefficient of relaxed crystalline germanium at room temperature changes from about 1000 cm−1 at 1500 nm to about 126 cm−1 at 1600 nm. In further embodiments, the current disclosure has realized that the interaction length may be increased by a factor of 8 to achieve similar level of absorption between wavelengths of 1500 nm and 1600 nm. In some embodiments, a photodetector length of 240 um may allow 95% of light is absorbed at 1600 nm. In certain embodiments, extending a length of a photodetector, may be used in waveguide-integrated photodetectors (in contrast with surface normal incidence photodetectors), where light may be confined to a waveguide and propagates in the plane of the chip. In some embodiments, an interaction length of a photodetector may be as long as several millimeters or even centimeters.

In some embodiments, the current disclosure appreciates that, when fast response time of the photodetectors is required, relying on increasing interaction length of a photodetector to achieve high responsivity may not be practical. In certain embodiments, a limiting factor of photodetector speed may be the resistor-capacitor (RC) limit of the circuit, which is calculated as $1/(2*pi*R*C)$. In a particular embodiment, a photodetector with 10 ohms series resistance and 50 fF capacitance may have a RC-limited frequency of about 50 GHz when driving a 50 ohms load. In this particular embodiment, if the photodetector is made 4 times longer, the series resistance may drop to 2.5 ohms and the capacitance may increase to 200 fF, which in turn may change the RC-limited frequency to be 15 GHz, which may be unacceptable for some applications.

In other embodiments, the current disclosure has recognized that there may be sources of optical absorption that compete with interband absorption of a photodetector that does not contribute to responsivity. In certain embodiments, for high speed photodetectors, doping and metal contacts may often be placed very close to an optical signal to ensure electrons and holes are swept out quickly. In many embodiments, doping and metal contacts may become a significant source of optical absorption, and as a result, increasing a photodetector interaction length may not improves responsivity. In most embodiments, the current disclosure has realized that it may be important to increase the material interband absorption coefficient to increase the sensitivity of a photodetector.

In certain embodiments, an approach for increasing the semiconductor interband absorption coefficient at long wavelengths may be by heating up a photodetector. In most embodiment, with semiconductor materials, electronic energy bands may be formed as a result of interactions among atoms in lattice structures, which depends on physical spacing among atoms or lattice constants. In certain embodiments, as temperature increases, a material may expand, and physical spacing among atoms of the material may become larger. In most embodiments, as temperature increases, interactions between atoms decrease and, as a result, there may be a smaller energy band gap. In many embodiments, for wavelengths near or slightly beyond an energy band gap at room temperature, an interband absorption coefficient may be increased. In many embodiments, increased interband absorption by heating a material may allow improved responsivity without having to increase an interaction length. In further embodiments, other factors may also influence a band edge or band gap, for example, strain, doping, the material used, applied electrical field (Franz-Keldysh effect).

In many embodiments, a photodetector may be required to work over a relatively wide temperature ranges. In most embodiments, an operating range for a photodetector between of 0 C to 75 C is relatively common. In certain embodiments, at temperatures closer to 0 C photodetector responsivity may be poor for wavelengths close to or beyond the band edge. In some embodiments, for germanium photodetectors, estimated band edge shift vs temperature may be roughly 1 nm/C. In almost all embodiments, it may be favorable to operate a germanium photodetector at elevated temperature to ensure uniformly high responsivity across the wavelength range. In some embodiments, it may be favorable to operate a germanium photodetector at near 70 C to ensure uniformly high responsivity across the wavelength range. In many embodiments, it may be favorable to operate a germanium photodetector at elevated temperature such as 70 C to ensure an ability to detect light of longer wavelengths.

In some embodiments of the current disclosure, it may be possible to heat up a photodetector to improve its responsivity for wavelength beyond its room temperature band gap. Typically, however, electrical or optical circuits are engineered to function better at cooler rather than hotter temperatures. In most embodiments, in additional to negative effects of heating an electrical or optical system, there may be an undesired power cost to heat an electrical or optical system. In further embodiments, higher temperatures may cause a chip to have additional signal to noise distortion that typically may want to be avoided.

In certain embodiments, the current disclosure realizes the advantages of using a photodiode in combination with a localized heater to enable processing of longer wavelengths of light than may be possible at normal operating temperatures, such as room temperature or 0 C. In most embodiments, the current disclosure recognizes that the use of a localized heater may shift the bandgap of a material of a photodetector without heating components other than the photodetector. In some embodiments, the makeup of an electrical or optical system may not transmit heat well and a heated portion of a chip or optical system may result in a local but not a system wide warming.

In certain embodiments, one or more photodiodes may be integrated into a chip, electrical system, or optical system. In some embodiments, a chip may be a photonic integrated circuit (PIC). In many embodiments, in electrical or optical systems however, heating the electrical or optical system may have negative effects on the electrical or optical system.

In many embodiments, a localized heater may avoid a negative impact of heating other components. In most embodiments, the current disclosure may enable better detection of longer wavelengths of light. In most embodiments, it may be possible to monitor a temperature of a photodiode and selectively turn a local heater on and off or adjusting its power depending on the temperature of the photodiode. In most embodiments, selectively activating a local heater may ensure efficient power usage while enabling a photodetector to remain at a prefer temperature range to more efficiently detect light of different frequencies.

In certain embodiments, using a local heater instead of a heater for a whole package may lower power consumption by a factor of 100. In certain embodiments, heating a whole package may be on the order of watts of energy. In other embodiments, heating a photodiode locally may be on the order of 10 mW.

In certain embodiments, with a germanium photodiode with integrated local heater, the integrated heater may be set so the germanium temperature is not lower than 55 C. In some embodiments, a photodiode's temperature may be monitored through a temperature sensor, such as a thermistor or a diode. In most embodiments, based on a temperature indicated by a thermistor, a local heater may be powered to adjust temperature to a desired point. In most embodiments, when a temperature of a chip containing a photodiode is above 55 C, a heater may not be used. In other embodiments, if a desired temperature is lower than a typical chip maximum operating temperature (for example, 75 C), adding a heater may not degrade reliability of a photodiode. In most embodiments, a thermistor may be a thermally sensitive resistor that may exhibit a predictable and precise change in electrical resistance based on a change in temperature. In other embodiments, a temperature of a chip may be monitored by any device enabled to determine a temperature.

In alternative embodiments, there may be different approaches to integrate a local heater around a photodiode. In a particular embodiment with a vertical p-i-n photodiode, electrodes may connect a top material and a bottom silicon for carrier extraction. In this particular embodiment, a heater may be placed on the side to heat up germanium when needed. In another embodiment, a heater may be placed above a top electrode. In a further embodiment, a heater may be placed on the bottom silicon. In a still further embodiment, bottom doped silicon may be used as a heater element. In certain embodiments, forcing current either from left to right across a doped silicon region below germanium, or longitudinally along the same direction as the waveguide axis, may cause the doped silicon to function as a heater. In most embodiments, as an area required for heating a photodiode is small, for example, 5 um by 20 um, and the amount of electrical heating power required to heat up germanium to 55 C when the chip temperature is 5 C may quite small such as 10 mW or less.

In a still further embodiment, localized heating may be realized by a photodiode itself. In certain embodiments, an absorption process and photocurrent may be a source creating the desired heating. In some embodiments, if launched optical power or photocurrent is higher more power may be consumed in a photodiode. In certain embodiments, if applied reverse bias between the two collection electrodes is increased more power may be consumed in a photodiode. In many embodiments, if more power is consumed in a photodiode temperature may be increased. In some embodiments, an increase in temperature may lead to a shift in band edge. In certain embodiments, an increase in temperature may lead to improved responsivity. In some embodiments, using a photodiode as a local heater may not be as flexible as an external heater where heating power may be freely adjusted for the local heater and may not require large optical power or high bias, and a maximum local temperature may be better controlled.

Figure 1A:
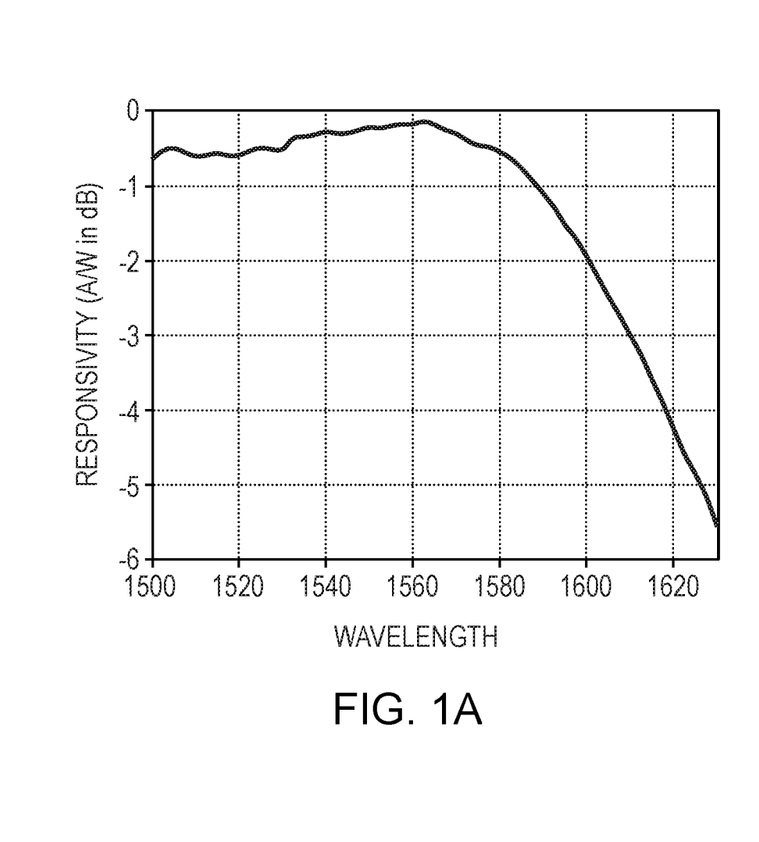
FIG. 1a is a simplified graph of measured responsivity verses wavelength for a typical waveguide-integrated germanium photodiode, in accordance with an embodiment of the present disclosure.

Refer now to the example embodiment of FIG. 1a, which illustrates responsivity at a given temperature for different wavelengths of light for Germanium. The example embodiment of this figure illustrates that as wavelength increases above a given wavelength, around 1560, the responsivity or the ability to detect the light, as measured by A/W in dB decreases. Thus, for the given temperature, the ability to detect light with a higher wavelength decreases.

Figure 1B:
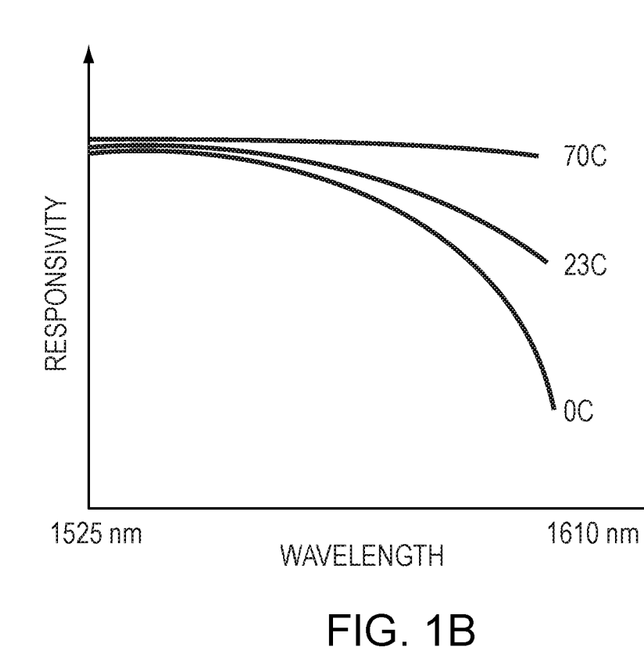
FIG. 1b is illustration of wavelength-responsivity curves at different temperatures, in accordance with an embodiment of the present disclosure.

Refer now to the example embodiment of FIG. 1b, which illustrates responsivity at three different temperatures to light at different wavelengths. As shown in the example embodiment of FIG. 1b, the drop off in the ability to detect light of higher wavelengths decreases as the temperature decreases. In particular, there is little to no drop off in the ability to detect light at 1610 nm for Germanium at a temperature of 70 C while Germanium of 0 C has experienced a large drop off in responsivity.

Figure 2A:
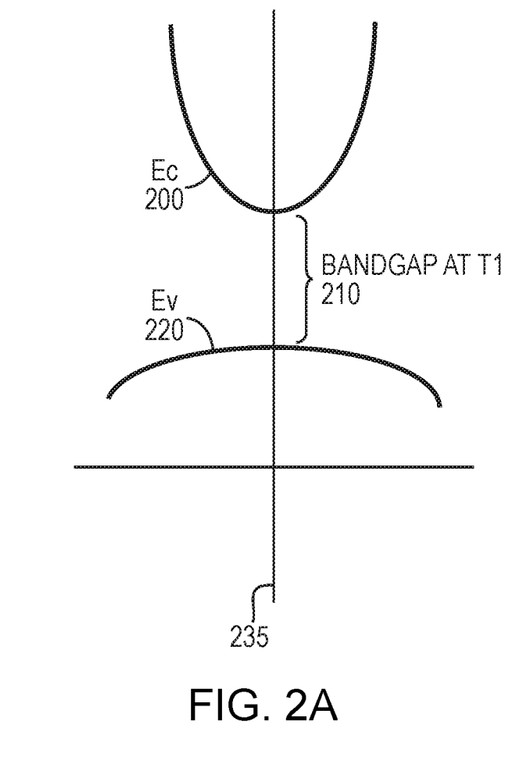
FIGS. 2a and 2b are simplified illustrations of a bandgap of a material at two different temperatures, in accordance with embodiments of the present disclosure.
Figure 2B:
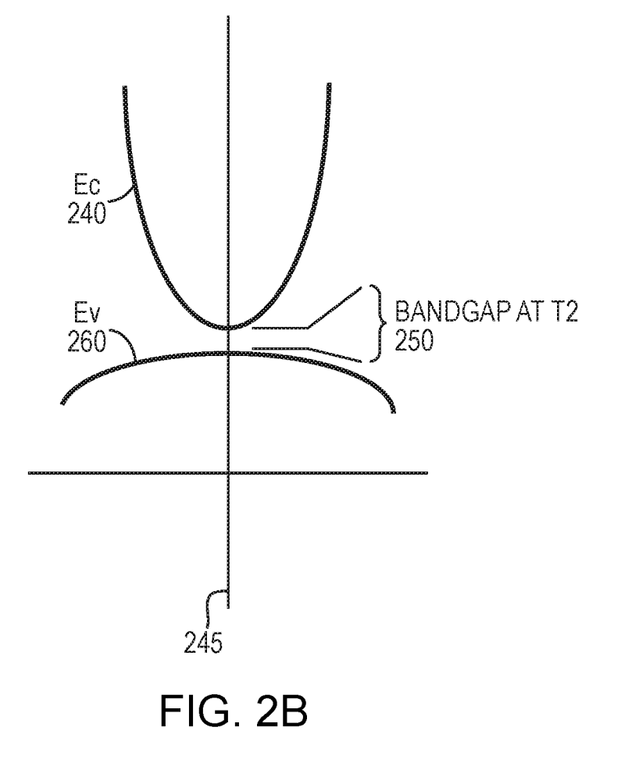

Refer now to the example embodiments of graph 235 and graph 245 of FIGS. 2a and 2b, which illustrate bandgaps at two different temperatures. In the example embodiment of graph 235, the difference between Ec 200 (conduction energy) and Ev 220 (valence energy) at temperature T1 is given by Bandgap 210. The bandgap refers to the amount of energy an electron needs to jump between Ec 200 and Ec 200. In the example embodiment of graph 245, the bandgap at a second higher temperature T2, between Ec 240 and EC 260 is given by Bandgap 250. The bandgap of the example embodiment of graph 245 is smaller than that of the bandgap of the example embodiment of graph 235 as the temperature in graph 245 has been increased over that in graph 235, causing the material to expand and the spacing between atoms to increase.

Figure 3A:
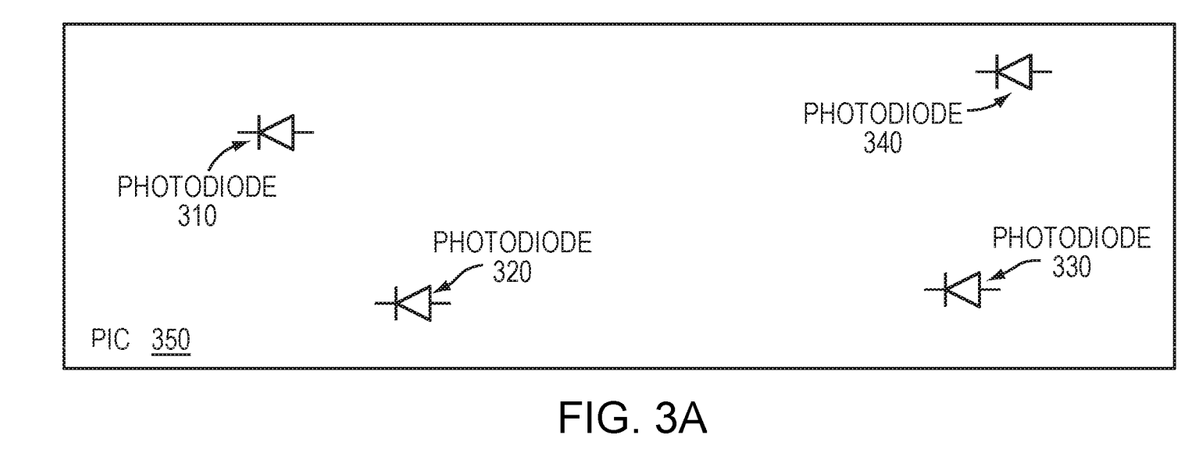
FIG. 3a is a simplified illustration of a chip with photodiodes, in accordance with an embodiment of the present disclosure.

Refer now to the example embodiments of FIGS. 3a and 1a. In the example embodiment of FIG. 3a, photodiodes 310, 320, 330, and 340 are arranged around PIC 350. In this embodiment, these photodiodes are made of Germanium and have the response characteristics of that of FIG. 1a. Specifically, the photodiodes experience a large drop of in being able to detect light waves around 1600 nm around room temperature.

Figure 3B:
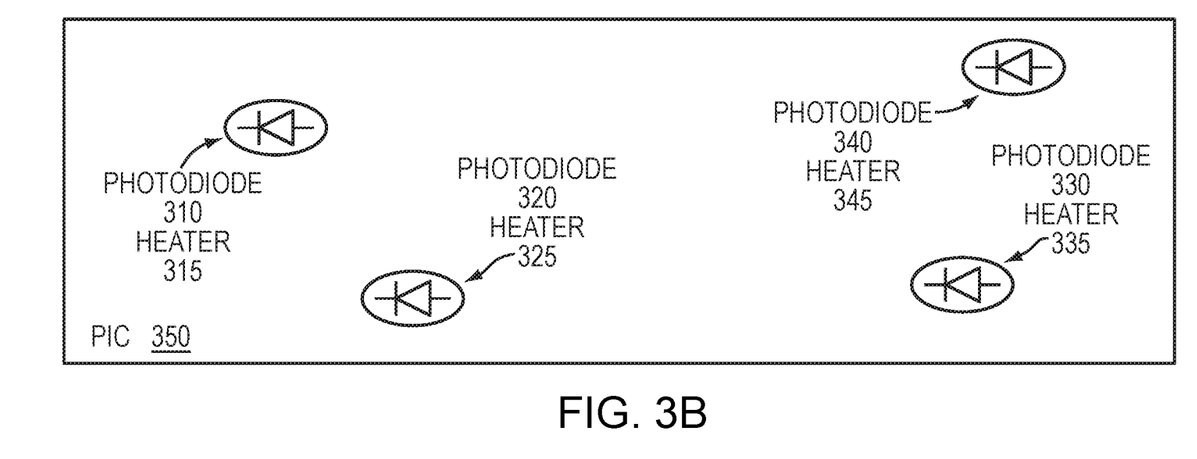
FIG. 3b is an alternative illustration of a chip with photodiodes, with local heater integrated with the photodiodes, in accordance with an embodiment of the present disclosure.

Refer now to the example embodiments of FIGS. 3b and 1b. In the example embodiment of FIG. 3a, photodiodes 310, 320, 330, and 340 are arranged around PIC 350 and collocated with each photodiode is a heater, such as heater 315, 325, 335, and 345. In this embodiment, these photodiodes are made of Germanium and through the use of the heater are able to be heated to around 70 C and thus have the response characteristics of the line at 70 C of FIG. 1c. Specifically, the photodiodes do not experience a large drop of in being able to detect light waves around 1600 nm at 70 C. As well, in this embodiment, the amount of PIC 350 that is heated in FIG. 3b is generally limited to the area surrounding each photodetector and does not otherwise heat up the rest of PIC 350. Thus, the example embodiment of FIG. 3b is able to used localized heating to enable a germanium photodetector to detect light at a temperature of 70 C when the ambient temperature and/or the temperature of the chip is cooler than 70 C.

Figure 4A:
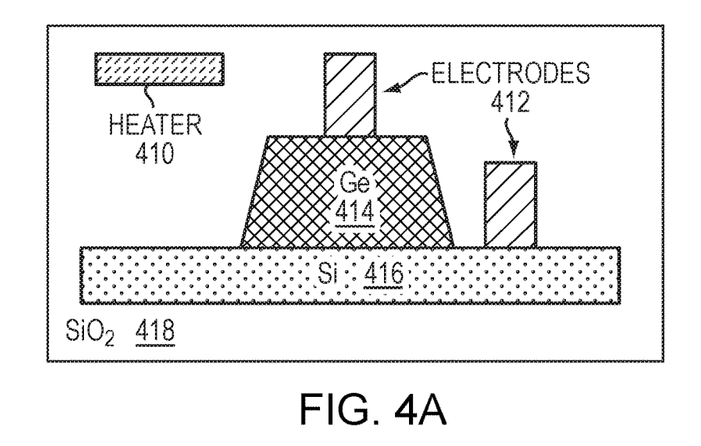
FIGS. 4a-4d illustrate different embodiments of a cross view of a local heater integrated near a germanium photodiode, in accordance with embodiments of the present disclosure.

Refer now to the example embodiment of FIG. 4a, which illustrates a sample placement of a heater on a germanium photodiode. In the example embodiment, heater 412 is placed above and to the left of germanium 414 and electrodes 412 are placed on top of and to the right of the germanium. Electrode 412 is also in contact with silicon 416. The photodiode is set in Silicon Dioxide 418.

Figure 4B:
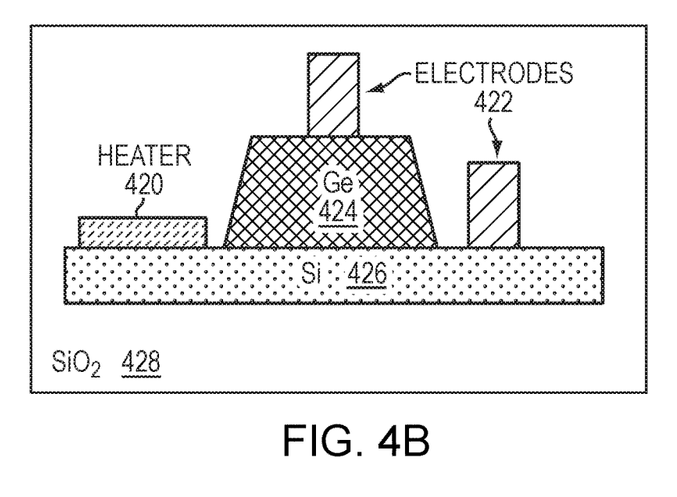

Refer now to the example embodiment of FIG. 4b, which illustrates a sample placement of a heater on a germanium photodiode. In the example embodiment, heater 422 is placed on Silicon 426 (either directly or with some spacing), and it is next to germanium 424 and electrodes 422 are placed on top of and to the right of the germanium. Electrode 422 is also in contact with silicon 426. The photodiode is set in Silicon Dioxide 428.

Figure 4C:
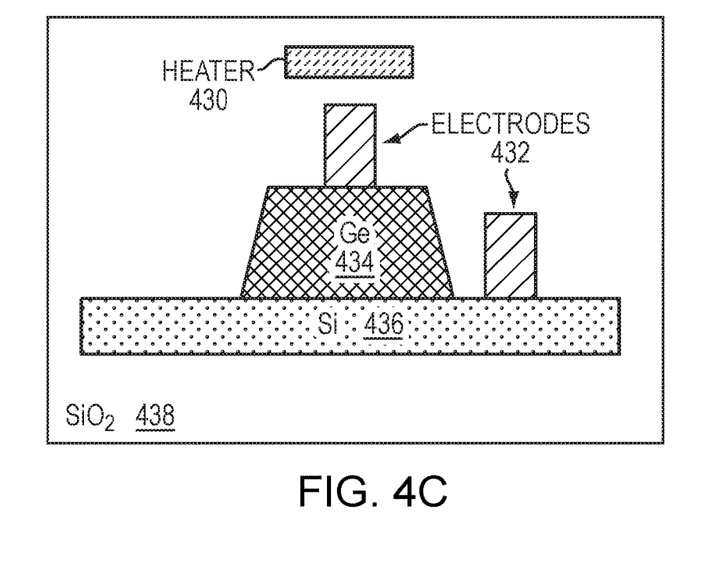

Refer now to the example embodiment of FIG. 4c, which illustrates a sample placement of a heater on a germanium photodiode. In the example embodiment, heater 432 is placed above germanium 434 and electrodes 432 are placed on top of and to the right of the germanium. Electrode 432 is also in contact with silicon 436. The photodiode is set in Silicon Dioxide 438.

Figure 4D:
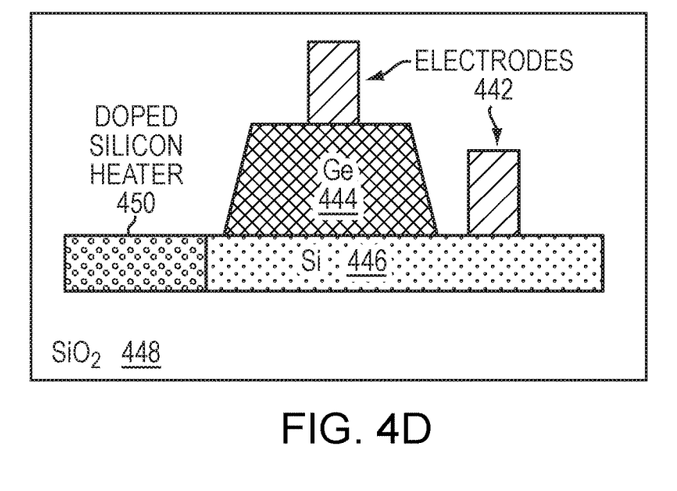

Refer now to the example embodiment of FIG. 4d, which illustrates a sample placement of a heater on a germanium photodiode. In the example embodiment, heater 450 is doped silicon to the left of Germanium 444 and part of Si 446. Germanium 444 and electrodes 422 are placed on top of Silicon 446 and one of electrodes 442 is placed on Germanium 444.

The example embodiments of FIGS. 4a-4d are merely illustrative of integrations of a heater near a photodetector and many other configurations exist within the spirit of the current disclosure. In a particular embodiment, there may be an electrode in contact with a left side of silicon, such as silicon 416.

In many embodiments, a heater may be controlled with feedback from a measured photodetector temperature or chip temperature. In some embodiments, there may be temperature sensor close to a photodiode so that a local temperature of the photodiode may be monitored. In such embodiments, a heater may be used to control a local temperature of the photodiode above a given temperature. In many embodiments, a sensor to measure temperature may be a thermistor. In other embodiments, a sensor to measure temperature may be a diode. In further embodiments, a sensor to measure temperature may be a heater element itself where the resistance of the heater change with temperature.

Figure 5:
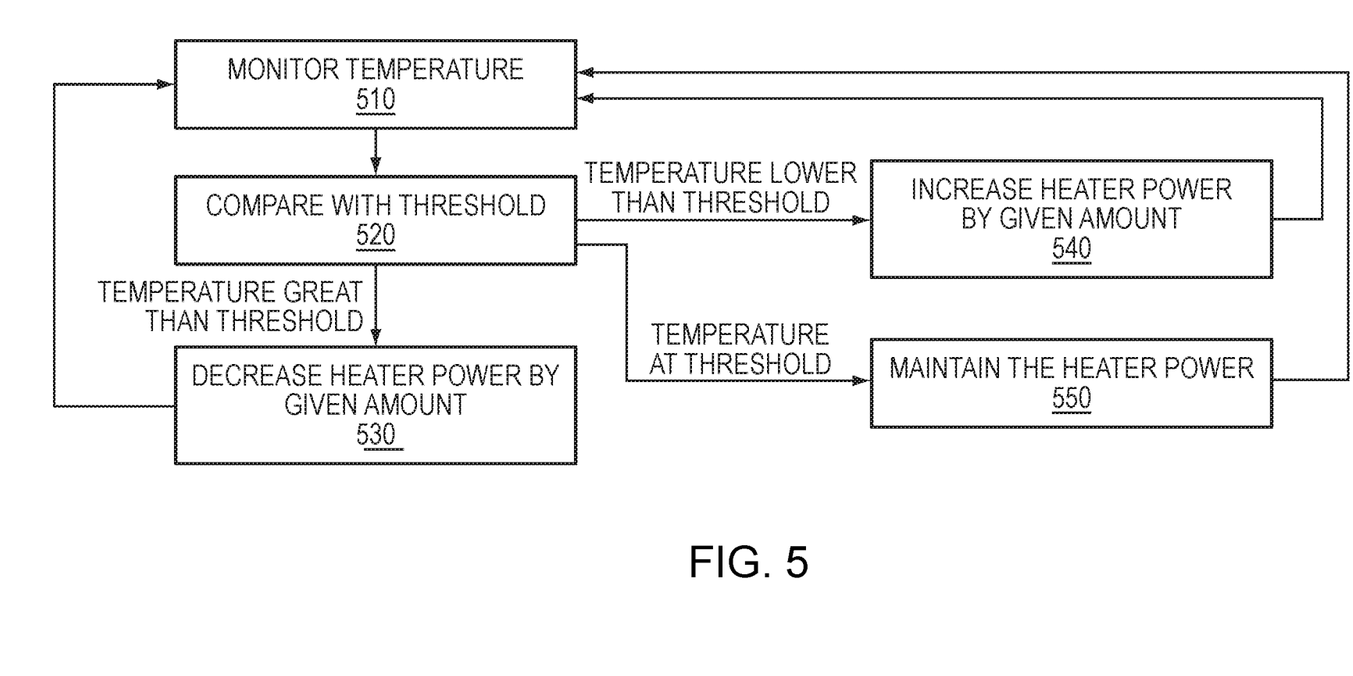
FIG. 5 is a simplified method of using a heater to warm a photodiode if the temperature is below a threshold, in accordance with an embodiment of the present disclosure.

Refer now to the example embodiment of a control method illustrated in FIG. 5. A temperature is monitored (step 510). A determination is made if the temperature is greater or less than a threshold (Step 520). If the temperature is greater than the threshold, the heater power is reduced by a given amount (step 530). In some embodiments, the amount may be a preset small and fixed value. In other embodiments, the amount may be determined depending on a difference between the current reading and the threshold. In most embodiments, once the heater power reaches zero, the heater may be considered turned off and may not be reduced further. In certain embodiments, where an ambient temperature is higher than the threshold, then no power may be supplied to a heater and a control method may keep the heater off.

Referring again to FIG. 5, if the temperature is lower than the threshold, the heater power is increased by a given amount (step 540). In some embodiments, the amount of an increase may be a preset small and fixed value. In other embodiments, the amount of an increase may be determined depending on the difference between a current reading and a threshold. Referring back to the example embodiment of FIG. 5, if the measured temperature is equal to the threshold, no adjustment is made to the heater power.

In many embodiments, a processor may perform the method of FIG. 5. In some embodiments, a processor may be on a silicon photonics chip. In other embodiments, a processor may be external to a silicon photonics chip.

In some embodiments, there may not be a temperature sensor in close proximity of a photodiode to monitor a local temperature of a photodiode. In other embodiments, there may be temperature sensor somewhere else on or off a chip that may be used to estimate the chip temperature or a local temperature of a photodiode when a heater is turned off, but not the photodiode local temperature when the heater is on. In certain embodiments, it may be possible to measure a temperature and compare it with a temperature threshold. In some embodiments, if a chip temperature is higher than a temperature threshold, a heater may be turned off. In other embodiments, if a chip temperature is lower than a temperature threshold, a heater power may be set depending on a delta between the two temperatures. In many embodiments, a scaling formula may be calculated or calibrated and used during operation of a chip.

In many embodiments, methods of the current disclosure may be performed on a processor. In certain embodiments, there may be multiple processors on a silicon chip. In some embodiments, a processor may be located outside of a silicon chip.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within +20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, or within ±2% of a target value in some embodiments. The terms "approximately" and "about" may include the target value.

What is claimed is:

1. An apparatus comprising:
   a temperature sensing device;
   a chip including a photodetector; wherein the photodetector includes a germanium-based photodiode, an electrode connected to the top of the germanium-based photodiode, and an integrated heater embedded in the chip; wherein the integrated heater is proximate to and above at least a portion of the electrode connected to the germanium-based photodiode; wherein the integrated heater is surrounded on all sides by an insulator material; wherein the integrated heater is enabled to increase a temperature of the germanium-based photodiode during operation of the germanium-based photodiode to detect an optical signal; wherein the temperature sensing device is enabled to determine the temperature of the germanium-based photodiode; and
   control logic to keep the temperature of the germanium-based photodiode at a temperature range to maintain high responsivity in detecting light throughout a range between 1525 nm and 1610 nm by controlling the heater using a temperature from the temperature sensing device.

2. The apparatus of claim 1 wherein the heater is a resistive heater.

3. The apparatus of claim 1 wherein the heater is a diode heater.

4. The apparatus of claim 1 wherein the temperature sensing device is off the chip.

5. The apparatus of claim 1 wherein the temperature sensing device is on the chip.

6. The apparatus of claim 5 wherein the temperature sensing device is located proximate to the germanium-based photodiode to monitor a local temperature of the germanium-based photodiode.

7. The apparatus of claim 1 wherein the apparatus further includes a processor communicatively coupled to the temperature sensing device to determine a temperature of the germanium-based photodiode; wherein the processor is further communicatively coupled to the heater and is enabled to control the heater.

8. The apparatus of claim 1 wherein the germanium-based photodiode is a waveguide integrated photodiode.

9. The apparatus of claim 8 wherein light is enabled to propagate longitudinally along a waveguide axis.

10. The apparatus of claim 1 wherein the germanium-based photodiode is kept at a temperature range between 55 degrees Celsius and 70 degrees Celsius.

11. A system comprising: a chip including a photodetector; wherein the photodetector includes a germanium-based photodiode, an electrode connected to the top of the germanium-based photodiode, and an integrated heater embedded in the chip; wherein the integrated heater is proximate to and above at least a portion of the electrode connected to the germanium-based photodiode; wherein the integrated heater is surrounded on all sides by an insulator material; wherein the integrated heater is enabled to increase a temperature of the germanium-based photodiode during operation of the germanium-based photodiode to detect an optical signal; and
  a temperature sensing device to determine the temperature of the germanium-based photodiode; and
  control logic; wherein the control logic enables:
    detecting the temperature of the germanium-based photodiode using the temperature sensing device;
    comparing the temperature to a threshold; and
    adjusting power to a heater power to control a temperature of the germanium-based photodiode to keep the temperature of the germanium-based photodiode at a temperature range to maintain high responsivity in detecting light throughout a range between 1525 nm and 1610 nm.

12. The system of claim 11 wherein the system further includes a processor.

13. The system of claim 11 wherein the heater is a resistive heater.

14. The system of claim 11 wherein the heater is a diode heater.

15. The system of claim 11 wherein the temperature sensing device is off the chip.

16. The system of claim 11 wherein the temperature sensing device is on the chip.

17. The system of claim 16 wherein the temperature sensing device is located proximate to the germanium-based photodiode to monitor a temperature of the germanium-based photodiode.

18. The system of claim 11 wherein the logic further enables: based on a comparison that the temperature of the chip is less than the threshold, turning the heater on if the heater is off.

19. The system of claim 11 wherein the control logic further enables: based on a comparison that the temperature of the chip is greater than the threshold, determining if the heater is being powered; and based on a determination that the heater is being powered, reducing the power to the heater.

20. The system of claim 11 wherein the germanium-based photodiode is a waveguide integrated photodiode.

21. The system of claim 20 wherein light is enabled to propagate longitudinally along a waveguide axis.

22. The system of claim 11 wherein the germanium-based photodiode is kept at a temperature range between 55 degrees Celsius and 70 degrees Celsius.

\* \* \* \* \*